United States Patent
Eckert et al.

(12) 
(10) Patent No.: US 6,455,443 B1
(45) Date of Patent: Sep. 24, 2002

(54) METHOD OF FABRICATING LOW-DIELECTRIC CONSTANT INTERLEVEL DIELECTRIC FILMS FOR BEOL INTERCONNECTS WITH ENHANCED ADHESION AND LOW-DEFECT DENSITY

(75) Inventors: Andrew Robert Eckert, Pittsburgh, PA (US); John C. Hay, Knoxville, TN (US); Jeffrey Curtis Hedrick, Montvale, NJ (US); Kang-Wook Lee, Yorktown Heights, NY (US); Eric Gerhard Liniger, Sandy Hook, CT (US); Eva Erika Simonyi, Bronx, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/789,422

(22) Filed: Feb. 21, 2001

(51) Int. Cl.⁷ .................. H01L 21/31; H01L 21/469
(52) U.S. Cl. ............... 438/781; 438/778; 438/780; 438/623
(58) Field of Search ................ 438/778, 780, 438/781, 623

(56) References Cited

U.S. PATENT DOCUMENTS

| | | | | |
|---|---|---|---|---|
| 4,732,858 A | * | 3/1988 | Brewer et al. | 437/228 |
| 4,950,583 A | * | 8/1990 | Brewer et al. | 430/311 |
| 5,622,896 A | * | 4/1997 | Knotter et al. | 438/123 |
| 5,905,117 A | * | 5/1999 | Yokotsuka et al. | 525/104 |
| 6,071,830 A | * | 6/2000 | Matsuzawa et al. | 438/778 |

\* cited by examiner

*Primary Examiner*—Alexander Ghyka
(74) *Attorney, Agent, or Firm*—Scully, Scott, Murphy & Presser; Daniel P. Morris

(57) ABSTRACT

A substantially defect-free, low-k dielectric film having improved adhesion is provided by (a) applying a silane coupling agent containing at least one polymerizable group to a surface of a substrate so as to provide a substantially uniform coating of said silane-coupling agent on said substrate; (b) heating the substrate containing the coating of the silane-coupling agent at a temperature of about 90° C. or above so as to provide a surface containing Si—O bonds; (c) rinsing the heated substrate with a suitable solvent that is effective in removing any residual silane-coupling agent; and (d) applying a dielectric material to the rinsed surface containing the Si—O bonds.

22 Claims, 1 Drawing Sheet

METHOD OF FABRICATING LOW-DIELECTRIC CONSTANT INTERLEVEL DIELECTRIC FILMS FOR BEOL INTERCONNECTS WITH ENHANCED ADHESION AND LOW-DEFECT DENSITY

FIELD OF THE INVENTION

The present invention relates to integrated circuits (ICs), and more particular to a method of fabricating an IC which includes at least a low-dielectric constant, k, interlevel dielectric film having improved adhesion, low-defect density and enhanced electrical properties associated therewith.

BACKGROUND OF THE INVENTION

The semiconductor industries drive to continually improve density and performance has forced the use of advanced interconnect structures. For example, copper, Cu, has been introduced as a wiring technology for 0.22 µm generation and below products, and by the 0.13 µm generation, it is expected that low-k dielectrics (materials that have a relative dielectric constant of 3.8 or below) will be combined with copper interconnects to further improve performance.

In the case of metallization, the choice of the new wiring material is reasonably straight forward, but the choice of the intermetal dielectric (IMD) is not as clear. Many new low-k dielectrics which are based on spin-on organic or glass materials have become recently available to the semiconductor industry. Extensive characterization and integration efforts are however needed to select appropriate candidates and then incorporate these materials into semiconductor products.

During the material selection process for IMD, emphasis is often placed on the electrical and chemical properties of the material. For example, an IMD for advanced interconnect applications must exhibit a low-dielectric constant, low-leakage, high-breakdown strength and good thermal stability at typical processing temperatures.

Although there maybe great emphasis on these properties during the initial evaluation process, mechanical properties and manufacturability issues play a large role, perhaps even a dominant role, in the selection of a dielectric for use in semiconductor manufacturing. For example, mechanical properties such as chemical-mechanical polishing (CMP) and packaging operations may damage soft dielectric structures; therefore the mechanical properties and manufacturability must also be taken into careful consideration when selecting an IMD.

Moreover, for many low-dielectric constant materials, an adhesion promoter is typically needed to ensure efficient adhesion of the low-k dielectric to the substrate. This in itself is a concern since many of the presently available low-k dielectrics such as spin-on organic or glass materials are extremely sensitive to defects caused by particle contamination which, in turn, may cause the dielectric to breakdown under bias at low-electrical fields. As such, typical adhesion promoters known in the art cannot be employed for low-k dielectrics.

U.S. Pat. Nos. 4,950,583 and 4,732,858 to Brewer, et al. describe an adhesion promoting product and process for treating an integrated substrate. Specifically, Brewer, et al. describe the use of alkoxysilane to improve the adhesion of a photoresist to a substrate as well as adding an activating catalyst to the alkoxysilane to enhance bonding at the interface. Further, Brewer, et al. describe the addition of an adjuvant polymer, such as methyl cellulose, to the alkoxysilane to enhance bonding to interfaces. In some examples, heating of the adhesion promoter (110–140° C. for 15–30 minutes) to improve adhesion is recommended.

The current invention describes a process to adhere an IMD to a substrate or interconnect layer to produce excellent adhesion after repeated thermal cycles while maintaining the electrical properties of the IMD (i.e., defect free films). The process entails spin applying the adhesion promoter, baking to promote reaction, rinsing with a solvent to remove the unreacted adhesion promoter (to prevent the formation of particulate defects in the subsequent IMD layer) followed by coating of the IMD layer. The process described by Brewer, et al. would result in a high concentration of particulate defects in the IMD rendering it unreliability and ineffective as an insulator.

U.S. Pat. No. 5,760,480 to You, et al. describe the use of a silane-based adhesion promoter which can be applied between the metal and dielectric layer or which can be incorporated in the dielectric layer. The current invention, as mentioned above, describes a process to adhere an IMD to a substrate or interconnect layer to produce excellent adhesion after repeated thermal cycles while maintaining the electrical properties of the IMD (i.e., defect free films). You, et al. do not describe a process or procedure to effectively utilize an adhesion promoter with a spin-on dielectric insulator.

In view of the drawbacks mentioned hereinabove concerning low-k dielectrics, there is a need for developing a method in which a low-k dielectric can be used in back-end of the line (BEOL) processing in which the low-k dielectric has improved adhesion, low-defect density and good electrical properties.

SUMMARY OF THE INVENTION

The present invention is directed to a method of fabricating an IC which includes at least a low-k dielectric material in contact with a substrate, wherein the low-k dielectric exhibits improved adhesion to the substrate and is substantially-free of defects. Such an IC can be obtained in the present invention by utilizing processing steps which include application of a high-concentration of a silane-coupling agent to a substrate, as well as a heating step and a rinsing step. It has been unexpectedly determined that each of these processing steps, which will be defined in more detail below, are essential in providing an IC which includes a substantially defect-free, low-k dielectric that has improved adhesion properties as well as good electrical properties.

Specifically, the processing steps of the present invention comprise:

(a) applying a silane-coupling agent containing at least one polymerizable group to a surface of a substrate so as to provide a substantially uniform coating of said silane-coupling agent on said substrate;

(b) heating said substrate containing said coating of said silane-coupling agent at a temperature of about 90° C. or above so as to provide a surface layer on said substrate containing Si—O bonds;

(c) rinsing said heated substrate with a suitable solvent that is effective in removing any residual unreacted silane-coupling agent; and (d) applying a dielectric material to said rinsed surface containing said Si—O bonds.

The silane-coupling agent employed in the present invention serves as an adhesion promoter for the dielectric material without causing any significant formation of defects therein. Moreover, by employing the silane-coupling agent of the present invention, it is possible to apply a low-k dielectric having a relative dielectric constant of about 3.8 or below in step (d) above. This allows for the formation of an interconnect structure having a substantially defect-free, low-k dielectric as an interlayer or intralayer dielectric.

DETAILED DESCRIPTION OF THE INVENTION

Figure 1:
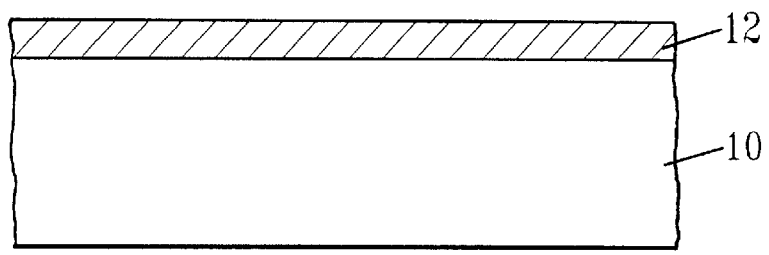
FIGS. 1–4 are pictorial views illustrating the basic processing steps that are employed in the present invention in forming an IC which includes a substantially defect-free, low-k dielectric that has improved adhesive properties associated therewith.

The present invention will now be described in more detail by referring to the drawings that accompany the present application. It is noted that in the accompanying drawings like reference numerals are used for describing like and/or corresponding elements.

Reference is first made to FIG. 1 which illustrates a structure that is formed after conducting the first step of the present invention, i.e., after applying a silane-coupling agent onto a surface of a substrate.

Specifically, the structure shown in FIG. 1 comprises substrate 10 having coating 12 comprised of a silane-coupling agent formed thereon.

Substrate 10 which is employed in the present invention may be a Si-containing semiconductor material such as Si, SiGe, and silicon-on insulators; a conductive metal such as Cu, Al, W, Pt, Ag, Au and alloys or multilayers thereof; a copper barrier material such as silicon nitride or an amorphous silicon carbide material which may (or may not) also contain nitrogen; or one of the interconnect levels of an interconnect structure. When substrate 10 is an interconnect level, the substrate may be composed of any conventional inorganic, e.g., $SiO_2$ or perovskite-type oxide, or organic, e.g., polyimide, dielectric material and it may contain conductive metal lines or vias therein. For clarity, substrate 10 does not show the presence of the conductive metal lines or vias, but nevertheless, the substrate may contain the same.

When substrate 10 is an interconnect level of an IC structure, it is fabricated using conventional techniques, including damascene, dual damascene and non-damascene such as metal etch processes that are well known to those skilled in the art. Since the fabrication of interconnect structures is well known and is not critical to the present invention, a detail discussion regarding the same is not provided herein.

The term "silane-coupling" agent is used herein to denote any silane-containing material having at least one polymerizable group therein which can serve as an adhesion promoter for a subsequent low-k dielectric material. Specifically, the silane-coupling agent employed in the present invention is an alkoxysilane that has the following formula:

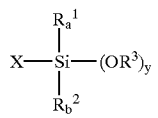

wherein X is a polymerizable group capable of undergoing a Diels-Alder reaction or a free radical reaction and is selected from alkenes, norborenylenes, vinyl and alkynes; $R^1$ and $R^2$ are the same or different and are H, alkyl, alkoxy, alkylester, alkenyl, alkynyl, aryl, or cycloalkyl; $R^3$ is alkyl or a $-C(O)R^4$ radical wherein $R^4$ is alkyl; a and b are the same or different and are 0, 1 or 2, and y is from 1–3, with the proviso that the sum of a+b+y is 3.

Various alkoxysilanes may be employed in the present invention, such as vinyltrialkoxysilane, allyltrialkoxysilane, vinyldiphenylalkoxysilane, norborenyltrialkoxysilane, and trivinyltrialkoxysilane. Some specific examples include vinyltriacetoxysilane, vinyltrimethoxysilane, vinyltriethoxysilane, allyltrimethoxysilane, vinyldiphenylethoxysilane, norborenyltriethoxysilane and trivinyltriethoxysilane. Of the various alkoxysilanes that may be employed in the present invention, vinyltrialkoxysilanes such as vinyltriacetoxysilane, vinyltrimethoxysilane and vinyldiphenylethoxysilane are preferred. Of these vinyltrialkoxysilanes, vinyltriacetoxysilane is most particularly preferred.

Notwithstanding which silane-coupling agent is employed herein, it is required in the present invention that the silane-coupling agent by applied in an amount so as to obtain a substantially uniform coating of the silane-coupling agent on the surface of the substrate. By "substantially uniform" it is meant that the silane-coupling agent is applied so as to obtain a continuous coating of silane-coupling agent on the substrate without any discontinuity therein.

To obtain the substantially uniform coating of silane-coupling agent on the surface of substrate 10, a concentrated solution of the silane-coupling agent is used. The term "concentrated" as used herein denotes a solution of silane-coupling agent, wherein the silane-coupling agent is present in a concentration of about 0.10% or higher, with a concentration of from about 0.2% to about 5.0% being more highly preferred. The most preferred concentration is about 2.5%. Typically, an organic solvent is used to dilute the alkoxysilane adhesive promoter. Examples of such solvents include: propylene glycol monomethyl ether acetate, propylene glycol monomethyl ether alcohol and cyclohexane. However, in some instances water may be used as the dilution solvent.

The silane-coupling agent may be applied to the substrate using any conventional means well known to those skilled in the art including, but not limited to: spin coating, spray coating, dip coating, brushing, evaporation, dissolution, and other means that are capable of forming a substantially uniform coating of silane-coupling agent on the substrate.

Figure 2:
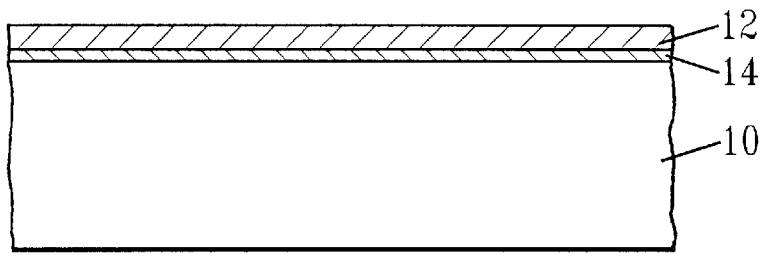

In accordance with the next step of the present invention, the structure shown in FIG. 1 is heated, i.e., baked, at a temperature of about 90° C. or above for a time period of about 10 to about 300 seconds, most preferably 120 seconds, to obtain a surface layer 14 on substrate 10 that contains Si—O bonds thereon, See FIG. 2. Specifically, the surface layer forms the following coupling:

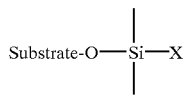

Substrate-O—Si—X wherein X is as defined above.

Specifically, this heating step is carried out at a temperature of from about 90° C. to about 200° C. for a time period of from about 10 to about 300 seconds. Moreover, this heating step which forms a coating on the surface of substrate having Si—O bonds is typically carried out in an inert gas atmosphere such Ar, He, $N_2$ or mixtures thereof.

Figure 3:
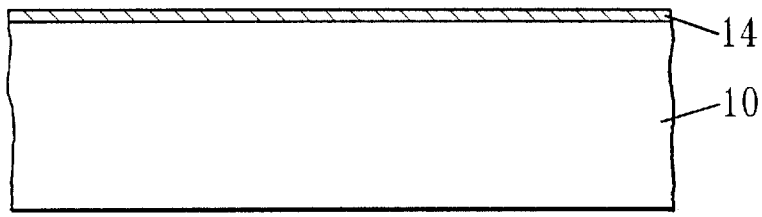

Following the heating step described above, the structure shown in FIG. 2 is subjected to a rinsing step that is effective in removing any residual unreacted silane-coupling agent from the structure leaving only a structure wherein substrate 10 has Si—O coating 14 thereon, See FIG. 3.

Specifically, the rinsing step of the present invention is carried out using a suitable solvent such as propylene glycol monomethyl ether acetate (PGMEA) which is capable of removing the silane-coupling agent from the structure without removing any substantial portion of Si—O coating 14. The rinsing step is typically carried out at temperature of 19–26° C., but elevated temperatures up to about 45° C. may be employed.

Following the rinsing step, an optional post-baking step may be utilized using the same or different conditions as mentioned above.

Figure 4:
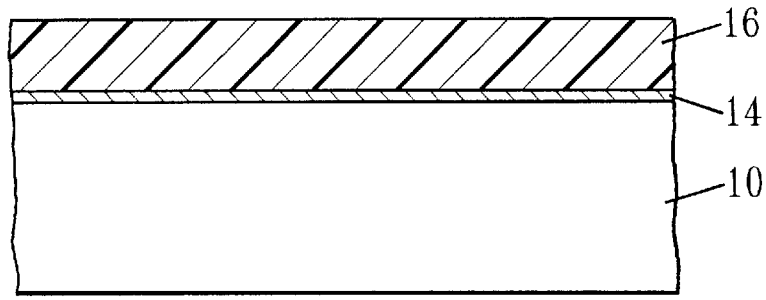

Next, and as shown in FIG. 4, a dielectric material 16 having a dielectric-constant of about 3.8 or below, i.e., low-k dielectric, is formed on Si—O treated surface 14 of substrate 10. The low-k dielectric is formed on the Si—O treated surface of the substrate by utilizing any conventional deposition process including, but not limited to: spin-on coating, chemical solution deposition, chemical vapor deposition (CVD), plasma-assisted CVD, evaporation, dip coating and other like deposition processes that are capable of forming a low-k dielectric layer on a structure.

Suitable low-k dielectrics that may be employed in the present invention include, but are not limited to: polyarylene ethers, thermosetting polyarylene ethers, aromatic thermosetting resins such as the SiLK® (semiconductor dielectric from The Dow Chemical Company); polyimides; Si-containing polymers such as hydrogensilsesquioxanes and organosilsesquioxanes; benzocyclobutenes; polynorboranes; parylene copolymers; parylene-F; polynapthalene; polytetrafluoronaphthalene; poly(octafluoro-bis-benzocyclobutene); Telfon-AF; fluorinated-amorphous carbon; Xerogels and nanoporous silica.

A description of each of the above low-k dielectrics, is found in the following articles that were published in MRS Bulletin, October 1997, Vol. 22, No. 10, the contents of which are incorporated herein by reference:

(i) T-M. Lu, et al., "Vapor Deposition of Low-Dielectric-Constant Polymeric Films", pp. 28–31;

(ii) Nigel P. Hacker, "Organic and Inorganic Spin-On Polymers for Low-Dielectric-Constant Applications", pp. 33–38;

(iii) Changming Jin, et al. "Nanoporous Silica as an Ultralow-k Dielectric", pp. 39–42; and (iv) Kazuhiko Endo, "Fluorinated Amorphous Carbon as a Low-Dielectric-Constant Interlayer Dielectric", pp. 55– 58.

Some highly preferred low-k dielectrics that are employed in the present invention include: methylsilsesquixoane (MSSQ), hydridosilsesquixoane and SiLK®.

The above processing steps can be repeated any number of times to provide a multi-level interconnect structure including substantially defect-free, low-dielectric constant materials that have good adhesion and good electrical properties.

It should be noted that the various processing steps mentioned above are critical in obtaining a substantially defect-free, low-dielectric constant material that has good adhesion and good electrical properties associated therewith. If one or more of the above described processing steps are omitted, the dielectric layer may lack good adhesion, may have a high-degree of defect density and/or it may have bad electrical properties associated therewith.

The following examples are given to illustrate some advantages that can be obtained utilizing the method of the present invention and show the importance of the inventive processing steps in obtaining a substantially defect-free, low-dielectric constant material that has good adhesion and good electrical properties.

EXAMPLES

Example 1

Three adhesion promoter solutions were prepared and evaluated to determine their ability to bond to a silicon containing substrate (i.e., form a Si—O covalent bond with a substrate). The substrate chosen was an 8" inch bare silicon wafer (n-type) with a thin (15 Å) native oxide coating. The three solutions comprised: (1) a 0.1% solution of 3-aminopropyltrimethoxysilane in propylene glycol monomethyl ether alcohol, (2) a 1.0% solution of vinyltriacetoxysilane in propylene glycol monomethyl ether acetate (PGMEA), and (3) a 2.5% solution of vinyltriacetoxysilane in PGMEA. Each solution contained 1 mol equivalent of water the partially hydrolyze the alkoxysilane (i.e., 3 mol equivalents would result in complete hydrolysis).

The adhesion promoter solutions were spun onto the 8 inch silicon substrates. Two sets of wafers were prepared with multiple wafers in each split, thus the values in Table 1 represent an average value. The first set of wafers received the following process flow: spin apply adhesion promoter (spin to dryness), test thickness, bake at 100° C. for 60 seconds, rinse with PGMEA, retest thickness and evaluate water contact angle on wafer surface (advancing contact angle). The second set of wafers received the following process flow: spin apply adhesion promoter (spin to dryness), test thickness, NO BAKE, rinse with PGMEA, retest thickness and evaluate water contact angle on wafer surface (advancing contact angle).

The experiment results are tabulated below.

TABLE 1

| Sample/Process | Spin apply, test thickness, BAKE, rinse, retest thickness and evaluate contact angle | Spin apply, test thickness, NO BAKE, rinse, retest thickness and evaluate contact angle |
|---|---|---|
| 0.1% solution of 3-aminopropyltrimethoxy-silane | Initial thickness = 15.7 Å<br>Post rinse thickness = 17.1 Å<br>Contact Angle = 38 degrees | Initial thickness = 15.7 Å<br>Final thickness = 3.9 Å<br>Contact angle = 26 degrees |
| 1.0% solution of vinyltriacetoxysilane | Initial thickness = 37.0 Å | Initial thickness = 37.0 Å |

TABLE 1-continued

| Sample:Process | Spin apply, test thickness, BAKE, rinse, retest thickness and evaluate contact angle | Spin apply, test thickness, NO BAKE, rinse, retest thickness and evaluate contact angle |
|---|---|---|
| | Final thickness = 2.1 Å Contact angle = 65 degrees | Final thickness = 1.4 Å Contact angle = 11 degrees |
| 2.5% solution of vinyltriacetoxysilane | Initial thickness = 123 Å Final thickness = 5.1 Å Contact angle = 65 degrees | Initial thickness = 123 Å Final thickness = 1.5 Å Contact angle = 9 degrees |

The results in Table 1 show a comparison between an aminopropyltrimethoxysilane (APS) adhesion promoter and vinyltriacetoxysilane (VTAS) adhesion promoter at two different concentrations. The APS adhesion promoter provides a coating thickness of 15.7 Å as measured by an Optiprobe Instrument. The full thickness remains if the sample is baked and rinsed, however a substantial amount is removed if the bake step is removed. The thickness retention indicates that the adhesion promoter is very reactive.

Analysis of the VTAS (vinyltriacetoxysilane) adhesion promoter at two different concentrations reveals that this system does not possess the same level of reactivity. The theoretical thickness for a monolayer of adhesion promoter is approximately 5 Å. Evaluation of the results in the Table 1 indicate that a monolayer of adhesion promoter can be achieved with a concentrated solution (concentrated relative to traditional adhesion promoters), an intermediate bake step and rinse. Removal of the bake results in almost complete removal of the adhesion promoter irregardless of the adhesion promoter concentration. And if the concentration is not sufficiently high (>2% for this system), complete coverage of the adhesion promoter is not achieved and a monolayer is not obtained.

All the adhesion promoters above covalently bond with hydroxyl functionalities on the surface of the substrate and change the surface properties of the wafer surface. The initial water contact angle of the bare silicon substrate with the native oxide layer is 6 degrees. Evaluation of Table 1 indicates that the surface is substantially modified except in the VTAS adhesion promoter without a bake process. This indicates that the bake is critical in modifying the surface properties of the wafer surface.

Example 2

Foreign matter (FM) (i.e., particular matter) significantly degrades the electrical properties of IMD's especially in reliability tests such as time dependent dielectric breakdown (TDDB), line to line leakage, etc. An experiment was conducted to determine the influence of the adhesion promoter on the amount of foreign matter in intermetal dielectric (IMD) films. The SiLK® semiconductor dielectric was spin coated onto silicon substrates with the adhesion promoter process described in the second column of Table 1 in Example 1. All samples possessed the 100° C. bake, however with and without the PGMEA rinse process. The results are shown in Table 2 below.

TABLE 2

| Sample\Process | Number of FM defects in SiLK® with adhesion promoter process possessing a PGMEA RINSE | Number of FM defects in SiLK® with adhesion promoter process possessing NO PGMEA RINSE |
|---|---|---|
| 1.0% solution of vinyltriacetoxysilane | FM < 10 | FM > 3000 |
| 2.5% solution of vinyltriacetoxysilane | FM < 10 | FM > 2800 |

The results in Table 2 indicate that the PGMEA rinse with VTAS adhesion promoters is essential in reducing FM defects in IMD layers (such as SiLK®).

Example 3.

Adhesion experiments were conducted using the three adhesion promoters described in the second column of Table 1 with the SiLK® Semiconductor Dielectric from The Dow Chemical Company. Two different adhesion tests were conducted; a modified edge lift off test (MELT) to evaluate the fracture toughness and a 90 degree peel test. The adhesion was evaluated after a single cure process and after six additional cure processes (T6) to simulate the effects of multiple thermal cure processes in a multilevel integration build. The SiLK® was cured at 385° C. in all cases. The results are shown in Table 3.

TABLE 3

| Sample | K Value (MPam$^{-1/2}$) As cured | K Value (MPam$^{-1/2}$) T6 | Peel Strength (g/mm) As cured | Peel Strength (g/mm) T6 |
|---|---|---|---|---|
| 0.1% APS | 0.44 | 0.30 | 18 | 7 |
| 1.0% VTAS | 0.48 | 0.39 | 18 | 13 |
| 2.5% VTAS | 0.56 | 0.42 | 24 | 21 |

The results in Table 3 indicate that the 2.5% VTAS adhesion promoter is superior for SiLK® with one cure and after an additional simulated six cure processes (T6). The APS adhesion promoter being an amine based system does not covalently bond with SiLK® and thus possesses the worst adhesive properties. The 1.0% VTAS adhesion promoter exhibits a significant reduction in adhesion at T6 due to the poor coverage of the adhesion promoter.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of fabricating an integrated circuit comprising the steps of:
    (a) applying a silane coupling agent containing at least one polymerizable group to a surface of a substrate to provide a substantially uniform coating of said silane-coupling agent on said substrate;
    (b) heating said substrate containing said coating of said silane-coupling agent at a temperature of about 90° C.

or above to provide a modified surface layer to said substrate containing Si—O bonds, said modified surface layer having a greater water contact angle than a non-heated substrate containing a coating of said silane-coupling agent;

(c) rinsing said heated substrate with a suitable solvent that is effective in removing any unreacted silane-coupling agent to provide a modified surface that is substantially free of particular matter; and (d) applying a dielectric material to said rinsed surface containing said Si—O.

2. The method of claim 1 wherein said substrate is a Si-containing substrate, a conductive metal, a metal barrier dielectric or an interlevel dielectric layer of an IC having metallic lines and vias formed therein.

3. The method of claim 1 wherein said silane-coupling agent is any silane-containing compound having at least one polymerizable group therein.

4. The method of claim 3 wherein said silane-coupling agent is a compound having the formula:

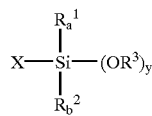

wherein X is a polymerizable group selected from alkenes, vinyl and alkynes; $R^1$ and $R^2$ are the same or different and are H, alkyl, alkoxy, alkylester, alkenyl, alkynyl, aryl, cycloalkyl; $R^3$ is alkyl or a —C(O)$R^4$ radical wherein $R^4$ is alkyl; a and b are the same or different and are 0, 1 or 2, and y is from 1–3, with the proviso that the sum of a+b+y is 3.

5. The method of claim 4 wherein said silane-coupling agent is an alkoxysilane.

6. The method of claim 5 wherein said alkoxysilane is selected from the group consisting of vinyltriacetoxysilane, vinyltrimethoxysilane, vinyltriethoxysilane, allyltrimethoxysilane, vinyldiphenylethoxysilane, norborenyltriethoxysilane and trivinyltriethoxysilane.

7. The method of claim 1 wherein said silane-coupling agent is vinyltriacetoxysilane.

8. The method of claim 1 wherein said silane-coupling agent is applied as a concentrated solution.

9. The method of claim 8 wherein said silane-coupling agent is present in said concentrated solution in a concentration of about 0.10% or higher.

10. The method of claim 9 wherein said silane-coupling agent is present in a concentration of from about 0.2% to about 5.0%.

11. The method of claim 10 wherein said silane-coupling agent is present in a concentration of about 2.5%.

12. The method of claim 1 wherein said silane-coupling agent is be applied to the substrate by spin-on deposition, spray coating, dip coating, brushing, evaporation, or dissolution.

13. The method of claim 1 wherein step (b) is carried out for a time period of about 10 seconds or above.

14. The method of claim 1 wherein step (b) is carried out at a temperature of from about 90° C. to about 200° C. for a time period of from about 10 to about 300 seconds.

15. The method of claim 1 wherein step (b) is carried out in an inert gas atmosphere.

16. The method of claim 1 wherein said solvent in step (c) is propylene glycol monomethyl ether acetate.

17. The method of claim 1 wherein an optional baking step is conducted after step (c), but prior to step (d).

18. The method of claim 1 wherein said dielectric material has a dielectric constant of about 3.8. or below.

19. The method of claim 1 wherein step (d) includes spin-on coating, chemical solution deposition, chemical vapor deposition (CVD), plasma-assisted CVD, evaporation, and dip coating.

20. The method of claim 1 wherein said dielectric material is a polyimide; a Si-containing polymer, a benzocyclobutene; a polynorborane; a polyarylene ether, a thermostatic polyarylene ether, an aromatic thermosetting resin; a parylene copolymer; parylene-F; polynapthalane; polytetrafluoronaphthalene; poly(octafluoro-bis-benzocyclobutene); Telfon-AF; fluorinated amorphous carbon; a Xerogel or a nanoporous silica.

21. The method of claim 1 wherein said dielectric material is methylsilsesquixoane (MSSQ), hydridosilsequixoane or an aromatic thermosetting resin.

22. The method of claim 1 wherein processing steps (a)–(d) are repeated any number of times to provide a multi-level interconnect structure.

* * * * *

UNITED STATES PATENT AND TRADEMARK OFFICE
CERTIFICATE OF CORRECTION

PATENT NO.    : 6,455,443 B1                                           Page 1 of 1
DATED         : September 24, 2002
INVENTOR(S)   : A. Eckert et al.

It is certified that error appears in the above-identified patent and that said Letters Patent is hereby corrected as shown below:

<u>Column 6, Table 1,</u>
Line 59, "Sample£rocess" should read -- Sample/Process --

<u>Column 7, Table 1-continued,</u>
Line 9, "Sample£rocess" should read -- Sample/Process --

<u>Column 9, Paragraph (d),</u>
Line 10, "Si-O." should read -- Si-O bond --

<u>Column 10,</u>
Lines 31-32, "thermostatic" should read -- thermosetting --

Signed and Sealed this

Twenty-ninth Day of July, 2003

JAMES E. ROGAN
*Director of the United States Patent and Trademark Office*